US007969801B2

(12) United States Patent
Cho

(10) Patent No.: US 7,969,801 B2
(45) Date of Patent: Jun. 28, 2011

(54) DATA INPUT CIRCUIT AND NONVOLATILE MEMORY DEVICE INCLUDING THE SAME

(75) Inventor: Yong Deok Cho, Gyeonggi-do (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 81 days.

(21) Appl. No.: 12/493,322

(22) Filed: Jun. 29, 2009

(65) Prior Publication Data

US 2010/0014365 A1    Jan. 21, 2010

(30) Foreign Application Priority Data

Jul. 17, 2008    (KR) .................. 10-2008-0069578
Jun. 8, 2009    (KR) .................. 10-2009-0050451

(51) Int. Cl.
    *G11C 7/00*    (2006.01)
(52) U.S. Cl. ............... 365/193; 365/233.1; 365/233.12; 365/235; 365/185.12

(58) Field of Classification Search .................. 365/193, 365/233.1, 233.12, 235, 185.12
See application file for complete search history.

(56) References Cited

U.S. PATENT DOCUMENTS

2002/0122348 A1*   9/2002   Lee et al. ...................... 365/233
* cited by examiner

*Primary Examiner* — Thong Q Le
(74) *Attorney, Agent, or Firm* — IP & T Group LLP

(57) ABSTRACT

A data input circuit includes a first data input unit, a second data input unit, and a clock unit. The first data input unit is configured to receive external data at rising edges of a data strobe signal and output the external data as first internal data in response to an internal clock. The second data input unit is configured to receive the external data at falling edges of the data strobe signal and output the external data as second internal data in response to the internal clock. The clock unit is configured to generate the internal clock using an external clock signal.

8 Claims, 4 Drawing Sheets

DATA INPUT CIRCUIT AND NONVOLATILE MEMORY DEVICE INCLUDING THE SAME

CROSS-REFERENCE TO RELATED APPLICATION

Priority to Korean patent application number 10-2008-0069578 filed on Jul. 17, 2008 and Korean patent application number 10-2009-0050451 filed on Jun. 8, 2009, the entire disclosure of each of which is incorporated by reference herein, is claimed.

BACKGROUND

An embodiment relates to a nonvolatile memory device and, more particularly, to a data input circuit configured to receive data at a double data rate (DDR) and a nonvolatile memory device including the same.

A nonvolatile memory device includes a memory cell array, a row decoder, and a page buffer. The memory cell array includes a plurality of word lines extending in rows, a plurality of bit lines extending in columns, and a plurality of cell strings corresponding to the respective bit lines.

Semiconductor devices, such as the above-described nonvolatile memory device, operate in response to a periodical clock. Here, a circuit has to be fabricated differently depending on when the circuit will operate while the clock is input. A flash memory device is typically configured to operate at the rising or falling edge of a clock.

FIG. 1A shows the data input apparatus of a nonvolatile memory device.

The nonvolatile memory device includes eight input/output (IO) pins configured to receive data as the unit of eight bits. Data IO means for receiving external input data EXT_IO<7:0> as internal data INT_IO<7:0> through the respective IO pins may be configured as in a data input unit 100 of FIG. 1A. The data input unit 100 may include a D flip-flop. The D flip-flop is configured to output data, received in response to a clock, without a change.

The data input unit 100 is configured to output data, input to an input terminal D in response to an input clock signal, to an output terminal Q. Here, the external input data EXT_IO<7:0> is input to the input terminal D, and the internal data INT_IO<7:0> is output from the output terminal Q. In the data input unit 100, an input control signal (write enable; WE#) functions as the clock signal.

An operational timing diagram of the data input unit 100 is described below.

FIG. 1B is a timing diagram showing an operation of FIG. 1A.

Referring to FIG. 1B, the external input data EXT_IO<7:0> is output as the internal data INT_IO<7:0> at the rising edge of the input control signal WE#.

The capacity of a nonvolatile memory device has continued to increase. With the increase in the memory capacity, the number of page buffers increases. For example, in a memory device having the memory capacity of 2 GB, the number of page buffers may be 2048. The number of page buffers of a memory device having the memory capacity of 8 GB may be 4096. Further, in a memory device having the memory capacity of 16 GB, the number of page buffers may be 8192 or more.

If the number of page buffers proportionally increases with an increase in the memory capacity, when external data is received for a program operation, the time that it takes to load the data on all the page buffers increases. The program time is greatly increased with the increase in the data loading time. It has a significant influence on the performance of a nonvolatile memory device.

Furthermore, the data loading time is becoming an important issue because mobile devices being developed are required to process high-capacity data at high speed.

BRIEF SUMMARY

One or more embodiments relate to a data input circuit configured to receive external input data through eight IO pins at double the rate and a nonvolatile memory device including the same.

A data input circuit of a nonvolatile memory device according to an aspect of the disclosure includes a first data input unit, a second data input unit, and a clock unit. The first data input unit is configured to receive external data at rising edges of a data strobe signal and output the external data as first internal data in response to an internal clock. The second data input unit is configured to receive the external data at falling edges of the data strobe signal and output the external data as second internal data in response to the internal clock. The clock unit is configured to generate the internal clock using an external clock signal.

The data strobe signal is configured to be input while the external data is input.

The data strobe signal and the external clock signal have the same frequency and amplitude.

The external data is configured to be input at the rising and falling edges of the external clock signal.

The first data input unit includes first IO means for receiving the external data and outputting data at the rising edges of the data strobe signal, second IO means for receiving the data from the first IO means and outputting data at the falling edges of the data strobe signal, and third IO means for outputting the data of the second IO means as the first internal data in response to the internal clock signal.

In order to receive the data from the first IO means and output data at the falling edges of the data strobe signal, the second IO means is configured to perform data IO at rising edges of an inverted signal of the data strobe signal.

The second data input unit includes fourth IO means for receiving the external data and output data at the falling edges of the data strobe signal, and fifth IO means for outputting the data of the fourth IO means as the second internal data in response to the internal clock signal.

In order to receive the external data and output data at the falling edges of the data strobe signal, the fourth IO means is configured to perform data IO at rising edges of an inverted signal of the data strobe signal.

Each of the first to fifth IO means is a D flip-flop.

A nonvolatile memory device according to another aspect of the disclosure includes a memory cell array, a page buffer unit, and a data IO unit. The memory cell array includes memory cells configured to store data. The page buffer unit includes page buffer circuits configured to temporarily store data to be programmed into the memory cell array. The data IO unit is configured to, when an address latch enable signal and a command latch enable signal both having a logic high level are input at the same time, receive external data at rising and falling edges of an external clock and transfer the external data to the page buffer circuits of the page buffer unit as internal data through two internal data buses.

The data IO unit includes a first data input unit configured to receive external data at the rising edges of a data strobe signal and output the external data as first internal data in response to an internal clock, a second data input unit configured to receive the external data at the falling edges of the data strobe signal and output the external data as second internal data in response to the internal clock, and a clock unit configured to generate the internal clock using an external clock signal.

The data strobe signal is configured to be input while data is input for a program operation.

The data strobe signal and the external clock signal have the same frequency and amplitude.

The external data is configured to be input at the rising and falling edges of the external clock signal.

The first data input unit includes first IO means for receiving the external data and outputting data at the rising edges of the data strobe signal, second IO means for receiving the data from the first IO means and outputting data at the falling edges of the data strobe signal, and third IO means for outputting the data of the second IO means as the first internal data in response to the internal clock signal.

The second data input unit includes fourth IO means for receiving the external data and output data at the falling edges of the data strobe signal, and fifth IO means for outputting the data of the fourth IO means as the second internal data in response to the internal clock signal.

DESCRIPTION OF EMBODIMENT

Figure 1A:
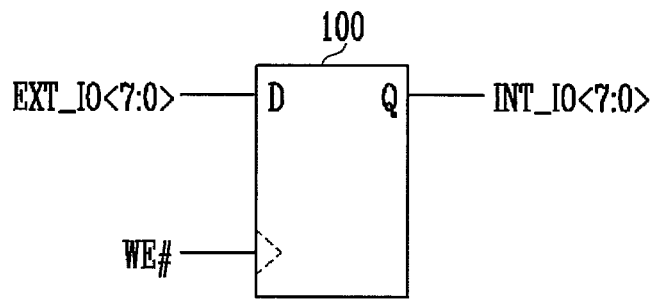
FIG. 1A shows the data input apparatus of a nonvolatile memory device.
Figure 1B:
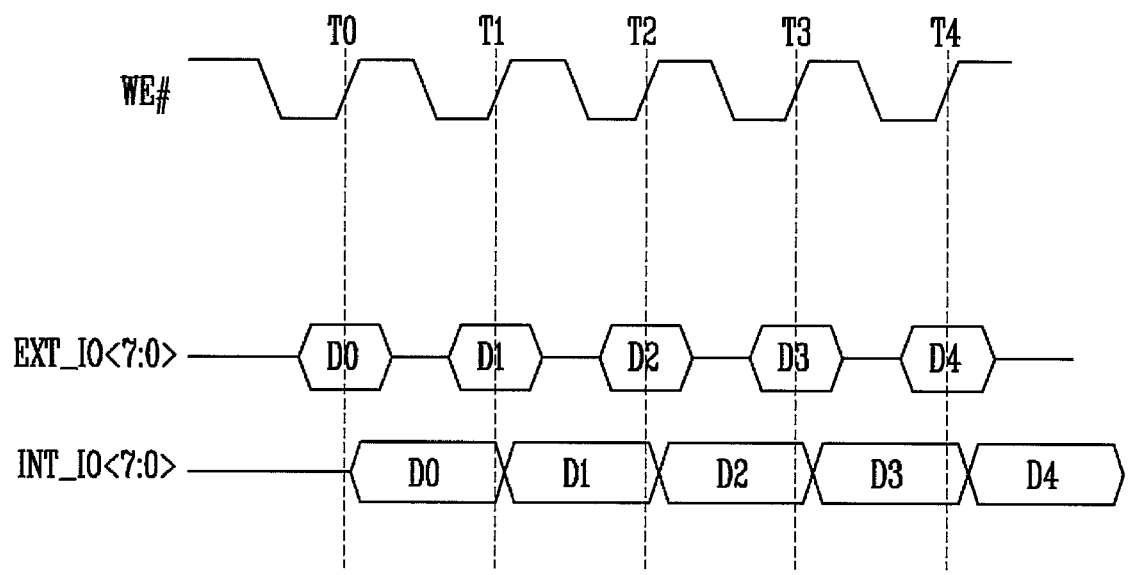
FIG. 1B is a timing diagram showing an operation of FIG. 1A.

Hereinafter, an embodiment of the present disclosure will be described in detail with reference to the accompanying drawings. The drawing figures are provided to allow those having ordinary skill in the art to understand the scope of the embodiment of the disclosure.

Figure 2A:
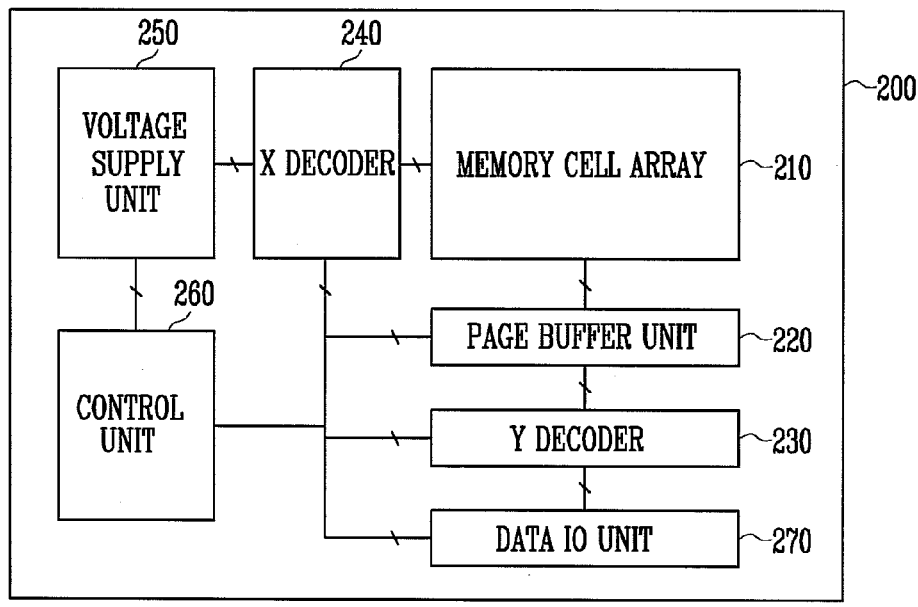
FIG. 2A is a block diagram of a nonvolatile memory device according to an embodiment.

FIG. 2A is a block diagram of a nonvolatile memory device according to an embodiment.

Referring to FIG. 2A, the nonvolatile memory device 200 according to the embodiment includes a memory cell array 210, a page buffer unit 220, a Y decoder 230, an X decoder 240, a voltage supply unit 250, a control unit 260, and a data IO unit 270.

The memory cell array 210 includes a plurality of memory cells for storing data. The memory cells are coupled together by word lines and bit lines. The page buffer unit 220 includes a plurality of page buffer circuits. The page buffer circuits are coupled to the bit lines of the memory cell array 210. The page buffer circuits are configured to temporarily store data input for a program and output the stored data to the bit lines when a program operation is performed or temporarily store data of a memory cell, received through the bit lines and output the stored data to the outside.

The Y decoder 230 is configured to provide a data IO path to the page buffer circuits of the page buffer unit 220. The X decoder 240 is configured to connect the word lines of the memory cell array 210 and global lines for supplying voltages of the voltage supply unit 250 in response to a control signal from the control unit 260.

The voltage supply unit 250 is configured to generate operation voltages for, for example, a program operation and a data read operation, in response to a control signal of the control unit 260 and output the operation voltages through the global lines. The control unit 260 is configured to output a control signal for controlling an operation of the nonvolatile memory device 200 as described above.

The data IO unit 270 is configured to output external input data EX_IO<7:0>, received through eight IO pins coupled to the outside, as internal data INT_IO<7:0> and to transfer the internal data to the page buffer unit 220 via the Y decoder 230, or to output data, received from the page buffer 220, to the outside.

The data IO unit 270 is configured to receive the external input data EXT_IO<7:0> at the rising edge and the falling edge of an additional data strobe signal DS and to transfer the external input data EXT_IO<7:0> to the page buffer unit 220 via the Y decoder 230 as the internal data INT_IO<7:0>. Here, the internal data INT_IO<7:0> is divided into even data INT_IO_EVEN<7:0> input at the rising edge of the data strobe signal DS and odd data INT_IO_ODD<7:0> input at the falling edge of the data strobe signal DS. That is, the data IO unit 270 is configured to transfer the external input data through two data buses (even and odd data buses).

An external clock signal EXT_CLK (i.e., a reference clock) is input to the data IO unit 270 separately from the data strobe signal DS. The data IO unit 270 is described in more detail below.

Figure 2B:
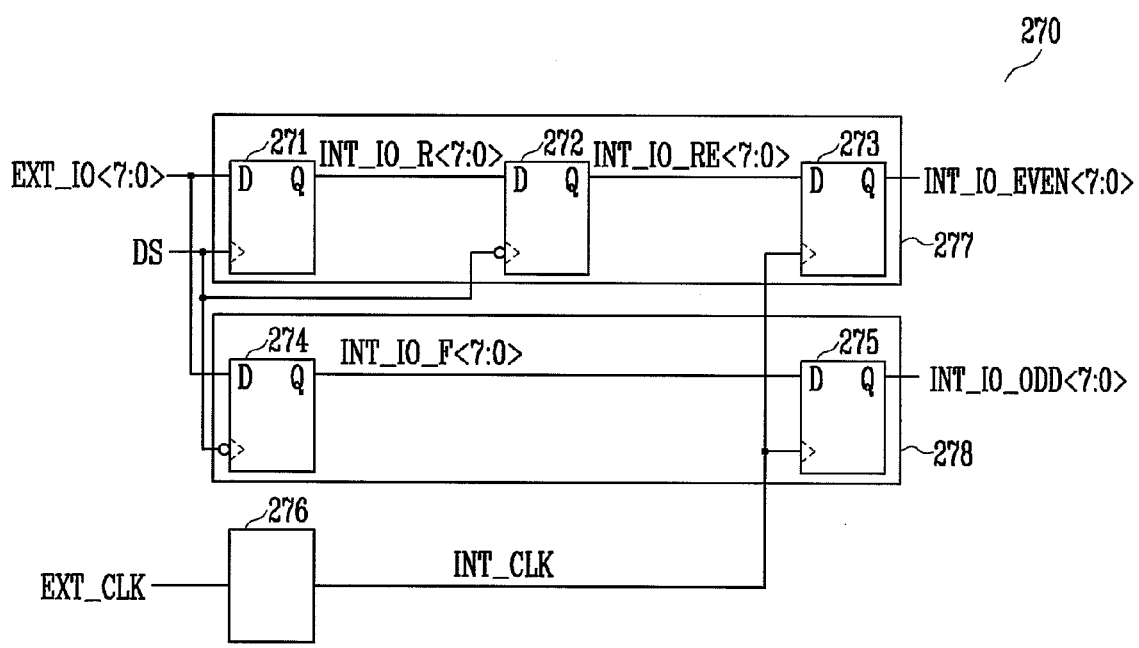
FIG. 2B is a block diagram of a data IO unit shown in FIG. 2A.

FIG. 2B is a block diagram of the data IO unit 270 shown in FIG. 2A.

Referring to FIG. 2B, the data IO unit 270 includes an even data input unit 277, an odd data input unit 278, and a clock unit 276.

The even data input unit 277 includes first to third flip-flops 271 to 273, and the odd data input unit 278 includes fourth and fifth flip-flops 274 and 275.

Each of the first to fifth flip-flops 271 to 275 may be formed of a D flip-flop and is configured to output data or signals, input to an input terminal D, through an output terminal Q in response to a signal input to a clock terminal.

The first flip-flop 271 is configured to receive the external input data EXT_IO<7:0> through the eight IO pins of the nonvolatile memory device 200 and output the external input data EXT_IO<7:0> as first internal data INT_IO_R<7:0> at the rising edge of the data strobe signal DS.

Here, the external input data EXT_IO<7:0> is data input at the rising and falling edges of the external clock EXT_CLK. Further, the external clock EXT_CLK is the reference clock as described above and is continuously supplied regardless of an operation of the nonvolatile memory device 200.

The second flip-flop 272 is configured to receive the first internal data INT_IO_R<7:0> and output the first internal data INT_IO_R<7:0> as second internal data INT_IO_RE<7:0> at the falling edge of the data strobe signal DS. Here, the data strobe signal DS is inverted and input to the clock terminal of the second flip-flop 272 so that the second flip-flop 272 can output the first internal data INT_IO_R<7:0> at the falling edge of the data strobe signal DS. The data strobe signal DS is a signal input while data is input during data program.

The third flip-flop 273 is configured to receive the second internal data INT_IO_RE<7:0> and output the second internal data INT_IO_RE<7:0> as the even data INT_IO_EVEN<7:0> in response to an input internal clock INT_CLK. The internal clock INT_CLK is supplied in the form of a pulse. That is, the clock unit 276 generates the external clock EXT_CLK as the internal clock INT_CLK having a pulse form for an internal data output.

The fourth flip-flop 274 is configured to output the external input data EXT_IO<7:0> as third internal data INT_IO_F<7:0> at the falling edge of the data strobe signal DS. Here, the data strobe signal DS is inverted and input to the clock terminal of the fourth flip-flop 274 so that the fourth flip-flop 274 can output the third internal data INT_IO_F<7:0> at the falling edge of the data strobe signal DS.

The fifth flip-flop 275 is configured to receive the third internal data INT_IO_F<7:0> and output the third internal data INT_IO_F<7:0> as the odd data INT_IO_ODD<7:0> in response to the internal clock INT_CLK.

An operation of the data IO unit 270 is described below.

Figure 3A:
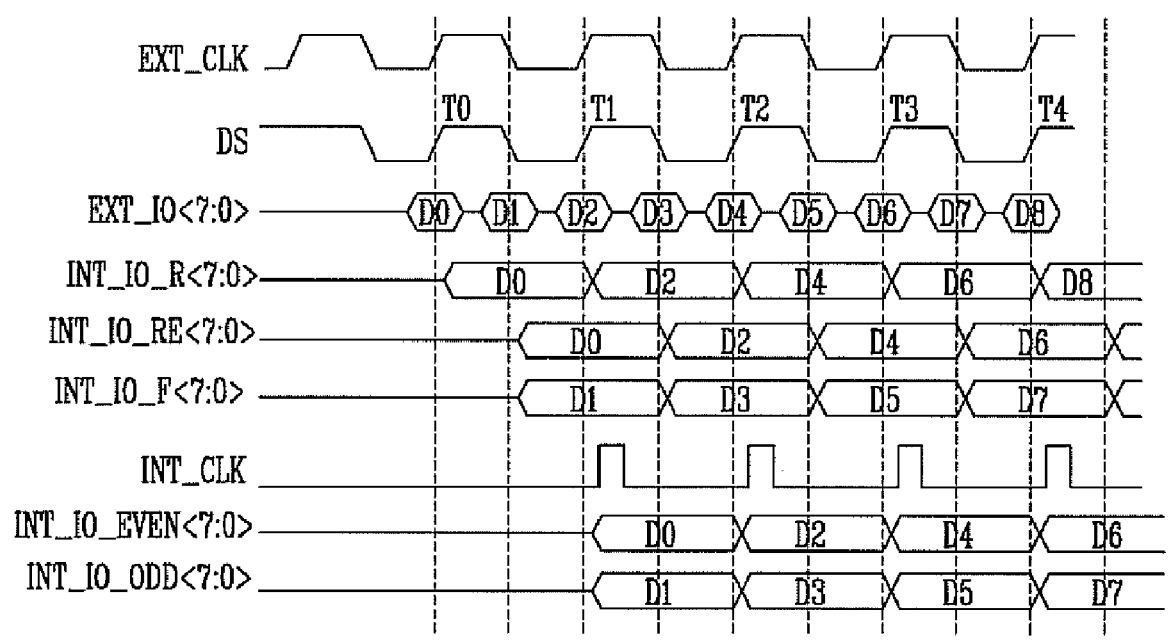
FIG. 3A is a timing diagram showing an operation of the data IO unit according to an embodiment.

FIG. 3A is a timing diagram showing an operation of the data IO unit according to an embodiment.

Referring to FIG. 3A, for an external data input, the external clock EXT_CLK and the data strobe signal DS, instead of the write enable signal WE#, and the external input data EXT_IO<7:0> are input.

For a data IO operation according to an embodiment of this disclosure, an address latch enable signal ALE and a command latch enable signal CLE both having a logic high level are input.

When an external operation command is input to a nonvolatile memory device, the address latch enable signal ALE and the command latch enable signal CLE are simultaneously input. The address latch enable signal ALE is input as a logic high level when address information is input, and the command latch enable signal CLE is input as a logic high level when a command is input. Thus, the two signals can have a logic high level at the same time depending on input of the address information and input of a command.

Accordingly, the nonvolatile memory device can be configured to operate the data IO operation according to the embodiment by applying the address latch enable signal ALE and the command latch enable signal CLE both having a logic high level. Furthermore, when both the address latch enable signal ALE and the command latch enable signal CLE do not have a logic high level, the nonvolatile memory device may perform a general data IO operation.

As shown in FIG. 3A, the external input data EXT_IO<7:0> is input at the rising and falling edges of the external clock EXT_CLK. The external clock EXT_CLK is changed to the internal clock INT_CLK by the clock unit 276 for an internal data input. The clock unit 276, as described above, outputs the internal clock INT_CLK which becomes a logic high-level pulse when the external clock EXT_CLK is in a logic high level. If the data strobe signal DS is input twice after the external clock EXT_CLK is input, the clock unit 276 outputs the internal clock INT_CLK.

Furthermore, after the data strobe signal DS is input, the external input data EXT_IO<7:0> is input rapidly at the rising and falling edges of the data strobe signal DS.

The first flip-flop 271 receives the external input data EXT_IO<7:0> at every rising edge of the data strobe signal DS. For example, when the external input data EXT_IO<7:0> is input as first to eighth data D0 to D7, the first flip-flop 271 receives the first data D0, the third data D2, the fifth data D4, and the seventh data D6 at the rising edges of the data strobe signal DS and outputs it as the first data INT_IO_R<7:0>.

Further, the second flip-flop 272 outputs the first, third, fifth, and seventh data D0, D2, D4, and D6 (i.e., the first data INT_IO_R<7:0> output from the first flip-flop 271) as the second data INT_IO_RE<7:0> at the falling edges of the data strobe signal DS.

Meanwhile, the fourth flip-flop 274 receives the external input data EXT_IO<7:0> at the falling edges of the data strobe signal DS and output it as the third data INT_IO_F<7:0>. Since the external input data EXT_IO<7:0> received at the falling edges of the data strobe signal DS is output as the third data INT_IO_F<7:0>, the second, fourth, sixth, and eighth data D1, D3, D5, and D7 are output as the third data INT_IO_F<7:0>.

The second internal data INT_IO_RE<7:0> output from the second flip-flop 272 and the third internal data INT_IO_F<7:0> output from the fourth flip-flop 274 are synchronized to each other at the falling edge of the data strobe signal DS.

Furthermore, the third and fifth flip-flops 273 and 275 output the even data INT_IO_EVEN<7:0> and the odd data INT_IO_ODD<7:0>, respectively, in synchronism with the internal clock INT_CLK. Accordingly, the data IO unit 270 of the nonvolatile memory device according to the embodiment can transfer the external input data EXT_IO<7:0> to the internal circuits through the even and odd data buses. Consequently, external data can be input to the internal circuits more rapidly.

Meanwhile, a correlation between the external clock EXT_CLK and the data strobe signal DS is described below.

Figure 3B:
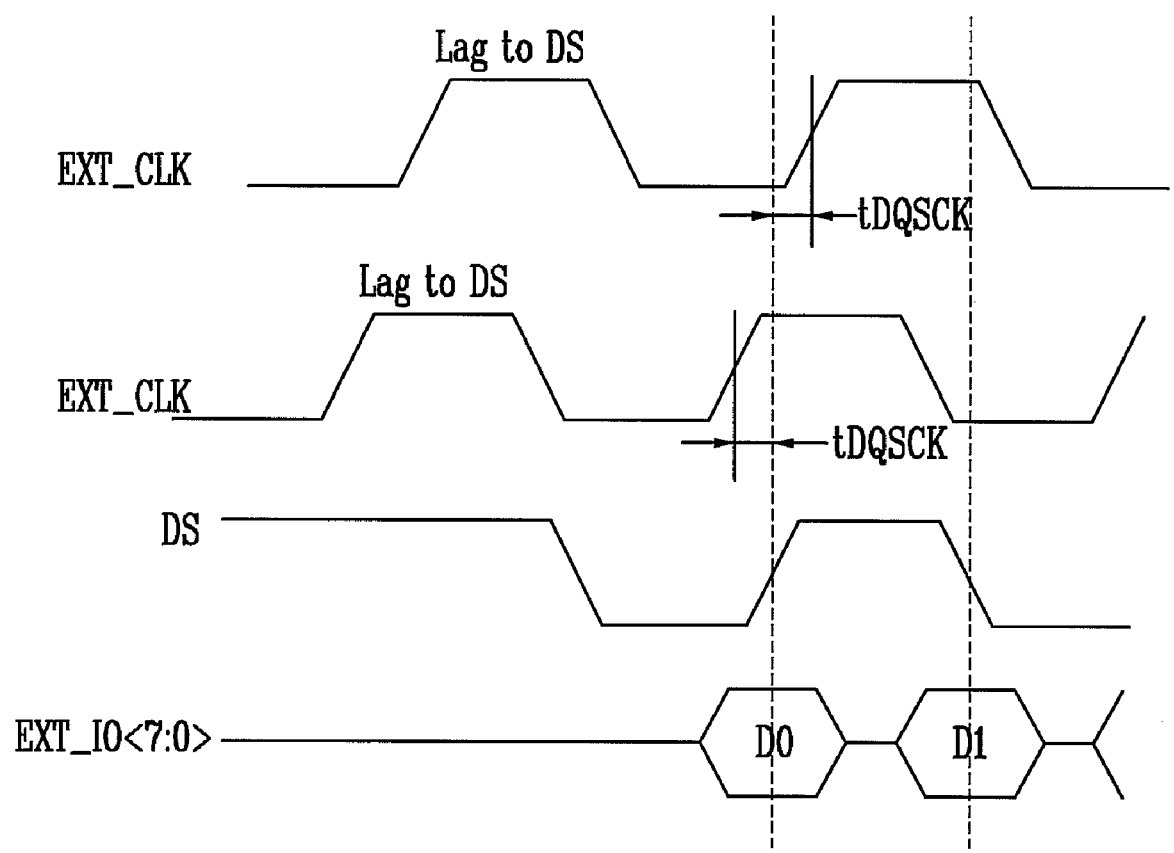
FIG. 3B is a timing diagram showing a correlation between an external clock and a data strobe signal in FIG. 3A.

FIG. 3B is a timing diagram showing a correlation between the external clock and the data strobe signal DS in FIG. 3A.

Referring to FIG. 3B, the external clock EXT_CLK and the data strobe signal DS preferably have the same amplitude and frequency/period. When there is an error, the error may be in a range satisfying the time tDQSCK. Here, the time tDQSCK may refer to a degree that is influenced by slew or jitter.

As described above, in accordance with the data input circuit and the nonvolatile memory device including the same according to the embodiment, comparatively large data can be received more rapidly because the data IO circuit configured to receive external input data at the rising and falling edges of a clock signal is used.

What is claimed is:

1. A nonvolatile memory device, comprising:
   a memory cell array comprising memory cells configured to store data;
   a page buffer unit comprising page buffer circuits configured to temporarily store data to be programmed into the memory cell array; and
   a data IO unit configured to receive external data at rising and falling edges of an external clock signal and transfer the external data to the page buffer circuits of the page buffer unit as internal data through two internal data buses, when an address latch enable signal and a command latch enable signal both having a logic high level are input at the same time.

2. The nonvolatile memory device of claim 1, wherein the data IO unit comprises:
   a first data input unit configured to receive the external data and output even data of the external data as first internal data in response to an internal clock signal;
   a second data input unit configured to receive the external data and output odd data of the external data as second internal data in response to the internal clock signal; and
   a clock unit configured to generate the internal clock signal using the external clock signal.

3. The nonvolatile memory device of claim 2, wherein a data strobe signal is configured to be input while data is input for a program operation.

4. The nonvolatile memory device of claim 3, wherein the data strobe signal and the external clock signal have a same frequency and amplitude.

5. The nonvolatile memory device of claim 2, wherein the first data input unit comprises:
   first IO means for receiving the external data and outputting the even data at rising edges of a data strobe signal;
   second IO means for receiving the even data from the first IO means and outputting the even data at falling edges of the data strobe signal; and
   third IO means for outputting the even data of the second IO means as the first internal data in response to the internal clock signal.

6. The nonvolatile memory device of claim 5, wherein the second data input unit comprises:
   fourth IO means for receiving the external data and outputting the odd data at falling edges of the data strobe signal; and
   fifth IO means for outputting the odd data of the fourth IO means as the second internal data in response to the internal clock signal.

7. The nonvolatile memory device claim 5, wherein, the second IO means is configured to output the even data at rising edges of an inverted signal of the data strobe signal in order to output the even data at the falling edges of the data strobe signal.

8. The nonvolatile memory device claim 6, wherein, the fourth IO means is configured to output the odd data at rising edges of an inverted signal of the data strobe signal in order to output the odd data at the falling edges of the data strobe signal.

* * * * *